US009142702B2

(12) United States Patent
Lutz et al.

(10) Patent No.: US 9,142,702 B2
(45) Date of Patent: Sep. 22, 2015

(54) SEMICONDUCTOR DRIFT DETECTOR AND CORRESPONDING OPERATING METHOD

(75) Inventors: Gerhard Lutz, München (DE); Heike Soltau, München (DE); Adrian Niculae, Gröbenzell (DE)

(73) Assignees: PNDetector GmbH, Munich (DE); PNSensor GmbH, Munich (DE)

( * ) Notice: Subject to any disclaimer, the term of this patent is extended or adjusted under 35 U.S.C. 154(b) by 86 days.

(21) Appl. No.: 14/125,470

(22) PCT Filed: Jun. 18, 2012

(86) PCT No.: PCT/EP2012/002566

§ 371 (c)(1), (2), (4) Date: Jan. 24, 2014

(87) PCT Pub. No.: WO2012/171664

PCT Pub. Date: Dec. 20, 2012

(65) Prior Publication Data

US 2014/0332692 A1 Nov. 13, 2014

(30) Foreign Application Priority Data

Jun. 17, 2011 (DE) ......................... 10 2011 104 489

(51) Int. Cl.
*G01T 1/24* (2006.01)
*H01L 31/115* (2006.01)
(Continued)

(52) U.S. Cl.
CPC .............. *H01L 31/115* (2013.01); *G01T 1/247* (2013.01); *H01J 37/244* (2013.01);
(Continued)

(58) Field of Classification Search
CPC .............. G01T 1/247; H01J 2237/2442; H01J 2237/2448; H01J 37/244; H01L 27/1443; H01L 31/02005; H01L 31/022416; H01L 31/115
See application file for complete search history.

(56) References Cited

U.S. PATENT DOCUMENTS 7,193,216 B2 3/2007 Kiuru
7,238,949 B2 7/2007 Struder et al.
(Continued)

FOREIGN PATENT DOCUMENTS

DE 102007017640 B3 9/2008
DE 102008014578 B3 11/2009
(Continued)

OTHER PUBLICATIONS

Sampietro et al., Bipolar feedback transistor integrated on detector with JFET for continuous reset, Nuclear Instruments and Methods in Physics Research, dated Jan. 11, 2000, pp. 5, vol. 439, Nos. 2-3.
(Continued)

*Primary Examiner* — Mark R Gaworecki
(74) *Attorney, Agent, or Firm* — Armstrong Teasdale LLP

(57) ABSTRACT

The invention relates to a semiconductor drift detector for detecting radiation, comprising a semiconductor substrate (HS), in which signal charge carriers are generated during operation, to be precise by incident photons (h·f) having a specific photon energy, more particularly in the form of X-ray fluorescent radiation, and/or by incident electrons (⊖), having a specific signal charge carrier current, more particularly in the form of back-scattered electrons (⊖), and comprising a read-out anode (A) for generating an electrical output signal in a manner dependent on the signal charge carriers, and comprising an erase contact (RC) for erasing the signal charge carriers that have accumulated in the semiconductor substrate (HS). The invention provides for the semiconductor drift detector to be optionally operable in a first operating mode or in a second operating mode, wherein the semiconductor drift detector in the first operating mode measures the photon energy of the incident photons (h·f), whereas the semiconductor drift detector in the second operating mode measures the signal charge carrier current. Furthermore, the invention encompasses a corresponding operating method.

20 Claims, 8 Drawing Sheets

AT RT FG DR2 HS DR1 A FS FD FG FS RG RC DR2 K dp A dn Rdp h·f ⊖ ⊖ h·f RK

Section A-A

Figure 1:
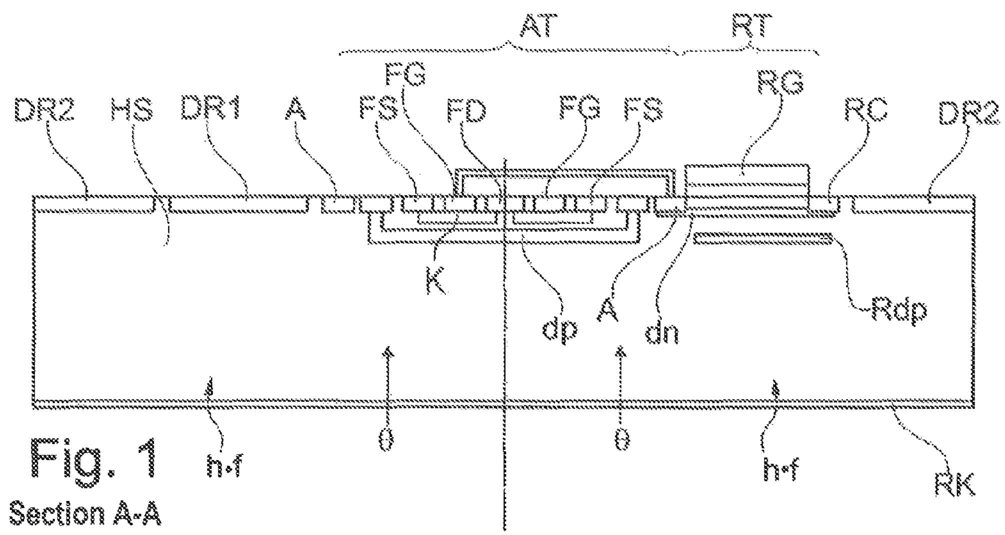

(51) Int. Cl.

| | |
|---|---|
| ***H01L 27/144*** | (2006.01) |
| ***H01L 31/02*** | (2006.01) |
| ***H01L 31/08*** | (2006.01) |
| ***H01J 37/244*** | (2006.01) |
| ***H01L 31/0224*** | (2006.01) |

(52) U.S. Cl.

CPC ..... *H01L 27/1443* (2013.01); *H01L 31/02005* (2013.01); *H01L 31/022416* (2013.01); *H01J 2237/2442* (2013.01); *H01J 2237/2448* (2013.01)

(56) References Cited

U.S. PATENT DOCUMENTS

| | | | |
|---|---|---|---|
| 7,514,687 | B2 | 4/2009 | Akahori et al. |
| 2008/0217543 | A1 | 9/2008 | Rohde |

FOREIGN PATENT DOCUMENTS

| | | | |
|---|---|---|---|
| DE | 102009026946 | A1 | 12/2010 |
| WO | 2010115873 | A1 | 10/2010 |

OTHER PUBLICATIONS

Radeka et al, Implanted Silicon JFET on Completely Depleted High-Resistivity Devices, dated Feb. 1989, pp. 91-94., vol. 10, No. 2.

Gauzzoni et al., Low noise, high count rate charge amplifier with detector embedded front-end transistor and continuous reset, IEEE, dated Oct. 24, 1999, pp. 356-359, vol. 1.

Niculae et al., Optimized readout methods of silicon drift detectors for high-resolution X-ray spectroscopy, Science Direct, dated Jul. 7, 2006, pp. 336-342.

Eggert et al., The spectral response of silicon X-ray detectors, Science Direct, dated Nov. 30, 2006, pp. 1-11., vol. 568, No. 1.

International Search Report, Patent Application No. PCT/EP2012/002566, dated Apr. 18, 2013, pp. 3.

Section A-A

Section B-B

Section B-B

Section B-B

SEMICONDUCTOR DRIFT DETECTOR AND CORRESPONDING OPERATING METHOD

The invention relates to a semiconductor drift detector for the detection of radiation and a corresponding operating method.

It is known from the prior of art to use so called semiconductor drift detectors for radiation detection. Here, the radiation to be detected generates signal electrons in a weakly doped, depleted semiconductor substrate, wherein several circular and concentrically arranged electrodes are arranged on a surface of the semiconductor substrate, wherein the electrodes generate a drift field in the semiconductor substrate through which the signal electrons generated by the radiation drift to a centrally arranged read-out element that detects the signal electrons and thus the absorbed radiation.

Here, the read-out element may consist of an integrated SSJFET (SSJFET: single sided junction field effect transistor) transistor (cf. V. Radeka et al., IEEE Electron Device Lett., vol. 10, pp. 91, 1989).

These conventional semiconductor drift detectors allow to quickly and very accurately measure radiation-generated signal charges. On the one hand, this is due to the small capacity of the charge collection anode. On the other hand, it is also advantageous that no connecting cables to an external electronics are needed due to the integration of the read-out transistor into the semiconductor drift detector, so that the parasitic capacitances that are usually associated with such connection cables are eliminated.

Such semiconductor drift detectors have been in use for spectroscopic investigations with the help of X-ray radiation for years. For example, such semiconductor drift detectors are used in electron microscopes to measure fluorescence radiation, the spectroscopic composition of which allows an item analysis of the investigated sample. It is, here, sometimes desirable to capture not only the photon-generated signal charge carriers in the semiconductor drift detector, but also to measure the ionization generated by incident electrons in the semiconductor drift detector. This is basically possible if the continuously incoming anode current and not the charge generated by single photons arriving in charge packages is measured.

The conventional semiconductor drift detectors are, however, only under substantial constraints capable of measuring both the photon energy of the incident photons and the signal charge carrier current, which is generated by incident electrons.

Furthermore, concerning the prior art, reference is to be made to DE 10 2007 017 640 B3, US 2008/0217543 A1, U.S. Pat. No. 7,514,687 B2, DE 10 2009 024 928 A1, U.S. Pat. No. 7,238,949 B2, DE 10 2009 026 946 A1, DE 10 2008 014 578 B3, U.S. Pat. No. 7,193,216 B2 and NICULAE, A. et al.: "Optimized readout methods of silicon drift detectors for high-resolution X-ray spectroscopy", Nuclear Instruments and Methods in Physics Research A 568 (2006), 336-342.

Therefore, the object of the invention is to improve the above-described conventional semiconductor drift detectors accordingly.

This problem is solved by a semiconductor drift detector according to the invention and a corresponding operating method in accordance with the independent claims.

The semiconductor drift detector according to the invention partly corresponds to the conventional semiconductor drift detector described above and has a semiconductor substrate in which, in operation, signal charge carriers are generated by incident radiation, which are then measured as a measure of the incident radiation. On the one hand, the signal charge carriers can be generated here by incident photons (e.g. X-ray photons) with a specific photon energy, wherein the incident radiation can be, for example, X-ray fluorescence radiation. On the other hand, the signal charge carriers can, however, also be generated by a plurality of incident electrons (e.g. back-scattered electrons), wherein the incident electrons produce or form a certain signal charge carrier current.

In addition, the semiconductor drift detector according to the invention has a read-out anode in order to generate an electrical output signal depending on the radiation-generated signal charge carriers, which forms a measure of the incident radiation.

In addition, the semiconductor drift detector according to the invention has a clear contact to erase the signal charge carriers collected in the semiconductor substrate, which is per se already known from conventional semiconductor drift detectors.

The semiconductor drift detector according to the invention differs from the semiconductor drift detectors described at the beginning in that the semiconductor drift detector can be operated optionally in a first operation mode or in a second operation mode.

In the first operation mode, the semiconductor drift detector measures the photon energy of the individual incident photons, electrons or ions or—more generally—of ionizing radiation quanta or particles.

In the second operation mode, the semiconductor drift detector, in contrast, determines the signal charge carrier current, which is generated through a plurality of incident electrons.

The semiconductor drift detector according to the invention is thus, in contrast to the conventional semiconductor drift detectors, suitable both for determining the energy of the incident photons and also for the measurement of the signal charge carrier current generated by a plurality of incident electrons.

In a preferred embodiment of the invention, a reset transistor is integrated to this effect into the semiconductor substrate, which connects the read-out anode with the clear contact in order to dissipate the photon-generated signal charge carriers and/or the electron-generated signal charge carriers to the clear contact, which allows the measurement of the signal charge carrier current and the measurement of the photon energy.

The reset transistor has a conductor channel with a specific channel length and a certain channel width, wherein the channel length of the conductor channel is preferably substantially greater than the width of the channel. The reset transistor is therefore preferably a long-channel transistor, which corresponds in its functioning to a resistance, which is controllable by the applied gate voltage.

For example, the channel length can be greater than 10 μm, 20 μm, 50 μm or 100 μm. The invention is, however, not limited with regard to the channel length of the conductor channel of the reset transistor, to the above mentioned exemplary values, but can basically also be realized with other values for the channel length.

It must, however, be mentioned here that the conductor channel of the reset transistor in the preferred embodiment has an adjustable electrical resistance, wherein the resistance is adjustable by applying a gate voltage to the gate of the reset transistor, as is described in more detail below.

In addition, the semiconductor drift detector according to the invention preferably has a read-out transistor integrated into the semiconductor substrate with a source, a gate and a drain, wherein the gate of the read-out transistor is connected in an electrically conductive manner with the read-out anode.

The read-out transistor can be, for example, a previously mentioned SSJFET transistor, which is known per se from the prior of art and must therefore not be described in more detail. However, the invention is not limited to a SSJFET transistor as regards the type of the read-out transistor, but can basically also be realized with other transistor types.

Furthermore, it should be mentioned that the semiconductor drift detector can have optionally a linear or circular structure.

For a linear semiconductor drift detector, several drift electrodes are provided for linearly one behind the other in the drift direction, wherein the drift electrodes generate a linearly aligned drift field in the semiconductor substrate.

Preferably, the semiconductor drift detector according to the invention is, however, annular and has therefore at least one drift ring, which surrounds the read-out anode in an annular manner and generates in the semiconductor substrate an electric drift field that lets the signal charge carriers drift to the read-out anode. In the preferred embodiment of such an annular semiconductor drift detector, the innermost drift ring is interrupted by a slot running from the inside outwards, wherein the reset transistor is arranged in the slot in such a manner that the conductor channel of the reset transistor runs along the slot.

Preferably, the slot then runs radially in the inner drift ring; however, other alignments of the slot are possible such as, for example, a meander-shaped course of the slot from the inside to the outside.

Furthermore, it should be mentioned that the slot in the innermost drift ring preferably runs through from the inside to the outside, so that the innermost drift ring is completely interrupted by the slot. This is useful, for example, if the clear contact is arranged outside the innermost drift ring. However, it is not absolutely necessary in the context of the invention that the slot runs through in the innermost ring from the inside to the outside. Rather, it is enough if the slot reaches the clear contact to allow transfer of the signal charge carrier to the clear contact.

Furthermore, it should be mentioned that the drift ring is preferably doped with a first doping type (e.g. p-doping), wherein the semiconductor substrate is underlayed in the slot of the innermost drift ring with a deep doping implantation of the first doping type (e.g. p-doping). This deep doping forms a shield between the semiconductor body and the reset transistor and takes on the drift field generating function of the drift ring. Thus, there are no restrictions with regard to the width of the slot. In extreme cases, the entire drift ring can be formed from this deep doping.

The first doping type is preferably p-doping, while the second doping type is preferably formed by a n-doping. However, within the framework of the invention, it is possible to invert the doping conditions, so that the first doping type is then n-doping, while the second doping type is formed by a p-doping.

Concerning the doping conditions in the semiconductor drift detector according to the invention, it should also be mentioned that the read-out anode is preferably doped according to the second doping type (e.g. n-doping) and that the conductor channel of the long-channel reset transistor preferably has a deep doping implantation of the second doping type (e.g. n-doping). Alternatively, it is also possible, however, within the framework of the invention that the reset transistor is formed as enhancement transistor, depletion transistor or as JFET transistor (JFET: Junction Gate Field Effect Transistor).

Furthermore, it is possible in the framework of the invention that a filter is provided for, which filters the incident radiation. Preferably, this filter is designed such that the incident electrons below a specific electron energy are filtered out for the most part or completely, while the incident photons (e.g. X-ray photons) are allowed through. This is advantageous when the photon energy of the incident photons should be measured while the incident electrons do not matter.

Here, it is possible that the filter is attached directly onto the semiconductor drift detector or even structurally integrated into the semiconductor drift detector. Alternatively, it is possible that the filter is arranged in the radiation path spatially separated from the semiconductor drift detector.

As an alternative to the filter, it is also possible to shield the detector by electric or magnetic fields against electrons or other electrically charged particles (electron trap). It is thus possible by switching on or off the field to use the same detector optionally or successively for the spectral measurement of photons and/or the electron current.

A substantial improvement of the signal read-out speed is achieved with the previously outlined proposals, which applies in particular for the electron measurement. Here, however, there is the problem that the read-out speed is dominated by the different drift times of the signal charge carriers, which are dependent on the incidence position of the radiation. It should be noted here that the duration of drift increases with the square of the distance to be covered. For a semiconductor drift detector with a single, relatively large radiation-sensitive detector surface, the radiation-generated signal charge carriers thus need relatively long to cover the required distance in the semiconductor drift detector, which limits the read-out speed. To resolve this issue, it is provided for in a variant of the invention that the semiconductor drift detector has a plurality of detector cells for the detection of incident radiation, wherein the detector cells are spatially separated from one another and independently collect signal charge carriers according to the incident radiation.

In the simplest case, the individual detector cells have each a separate read-out electronics, wherein, however, the read-out effort increases with the number of detector cells.

Preferably, a common read-out electronics is therefore provided, which parallelly reads out the detector cells. The read-out transistors of the detector cells can be interconnected each with their source, drain or the clear contact.

It is also in this regard to be noted that the detector cells can be each hexagonal, allowing a high packing density. In addition, the detector cells can be arranged together on the same semiconductor substrate. The connections between the read-out transistors of the individual detector cells can in this process be made directly on the monolithic multi-cell semiconductor drift detector.

It should also be mentioned that the invention is not limited to the previously described semiconductor drift detector according to the invention as a single component, but also comprises an electron microscope with such a semiconductor drift detector, wherein the inventive design of the semiconductor drift detector allows the measurement of fluorescence radiation and the measurement of backscattered electrons.

In addition, the invention comprises a corresponding operating method for a semiconductor drift detector according to the invention, as is apparent already from the above description, so that to avoid repetitions reference is made to the above description as regards the operating method.

Figure 2:
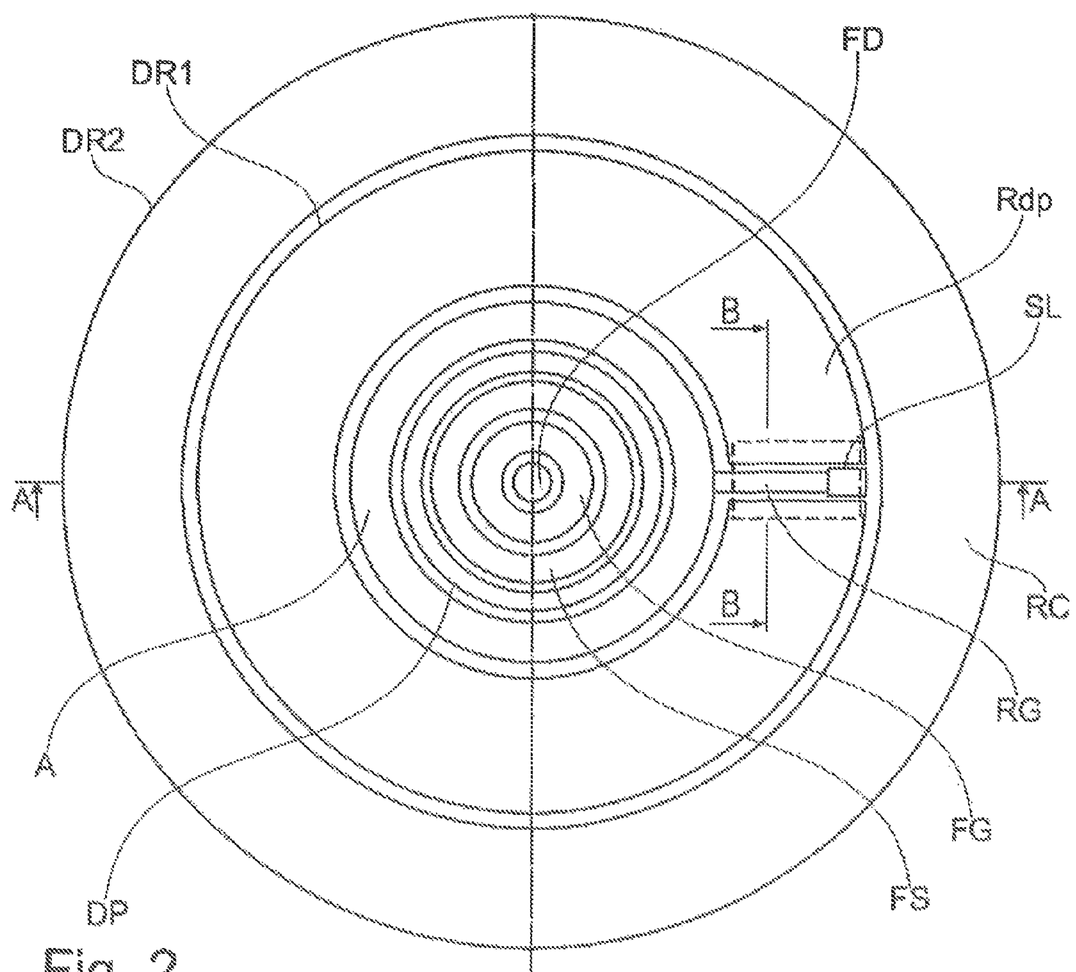
Figure 3A:
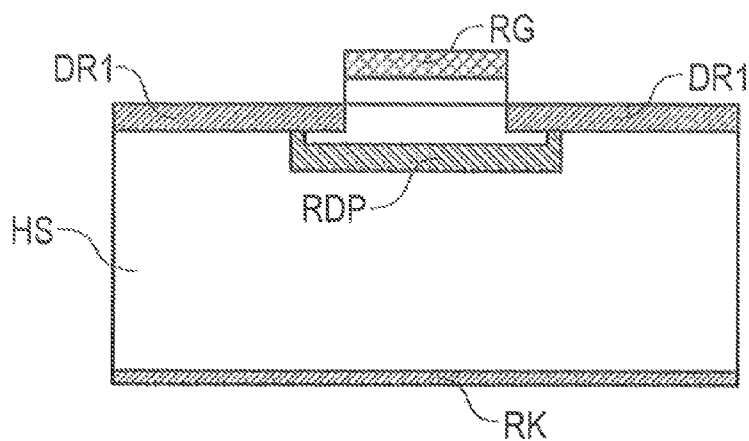
Figure 3B:
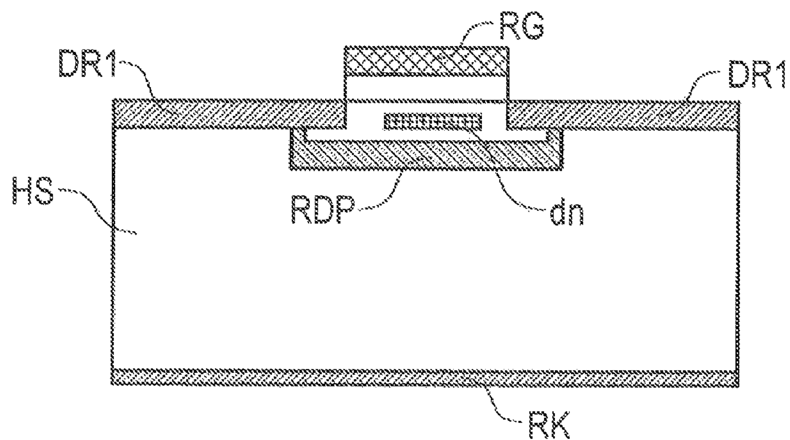
Figure 3C:
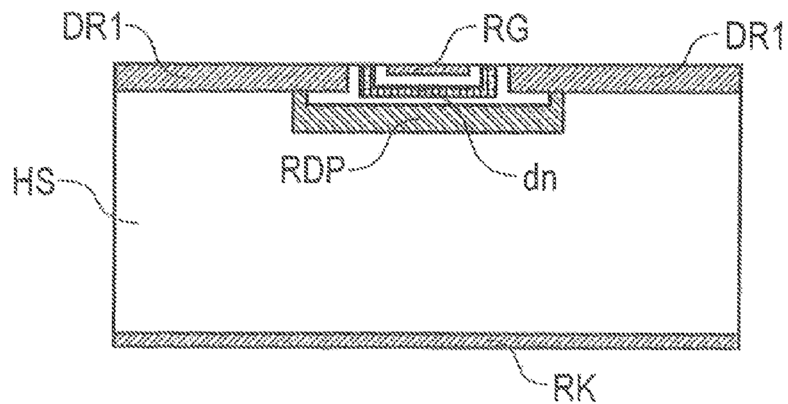
Figure 4:
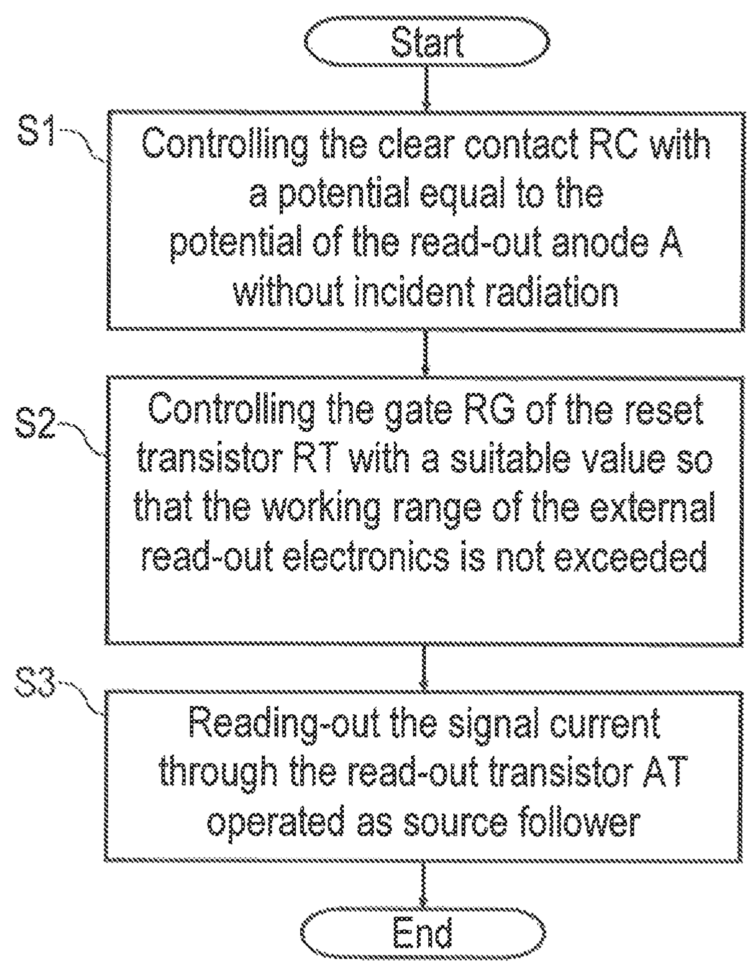
Figure 5:
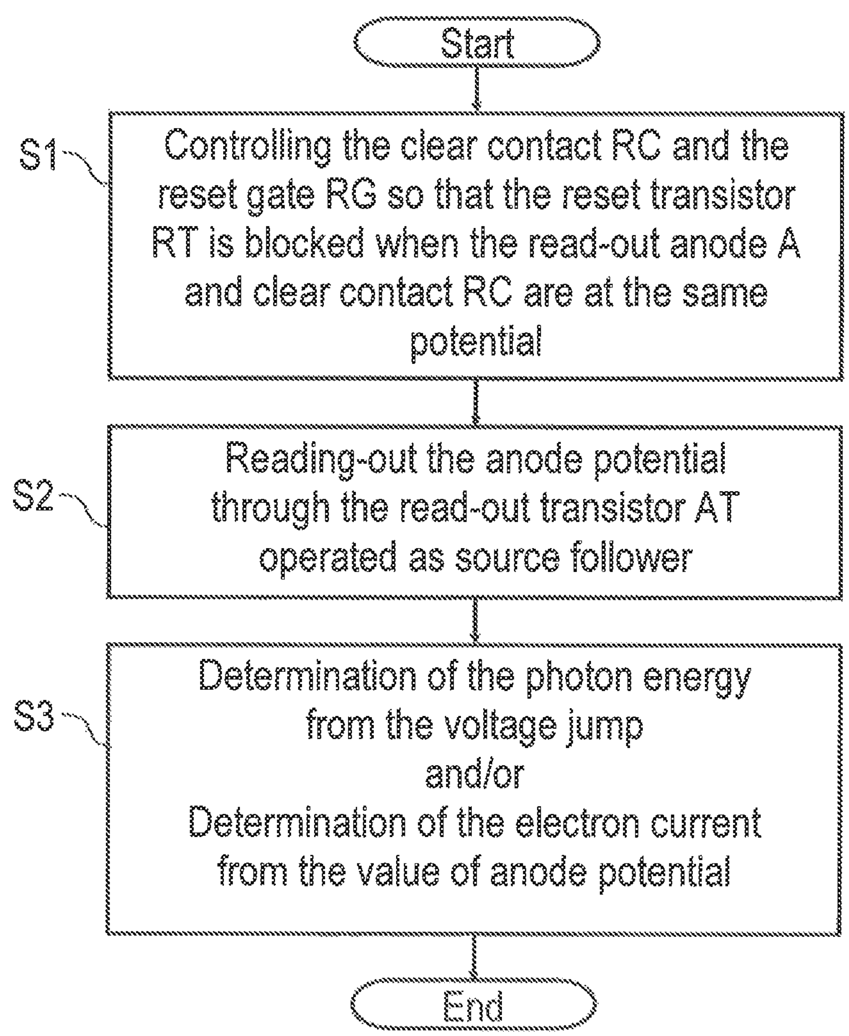
Figure 6:
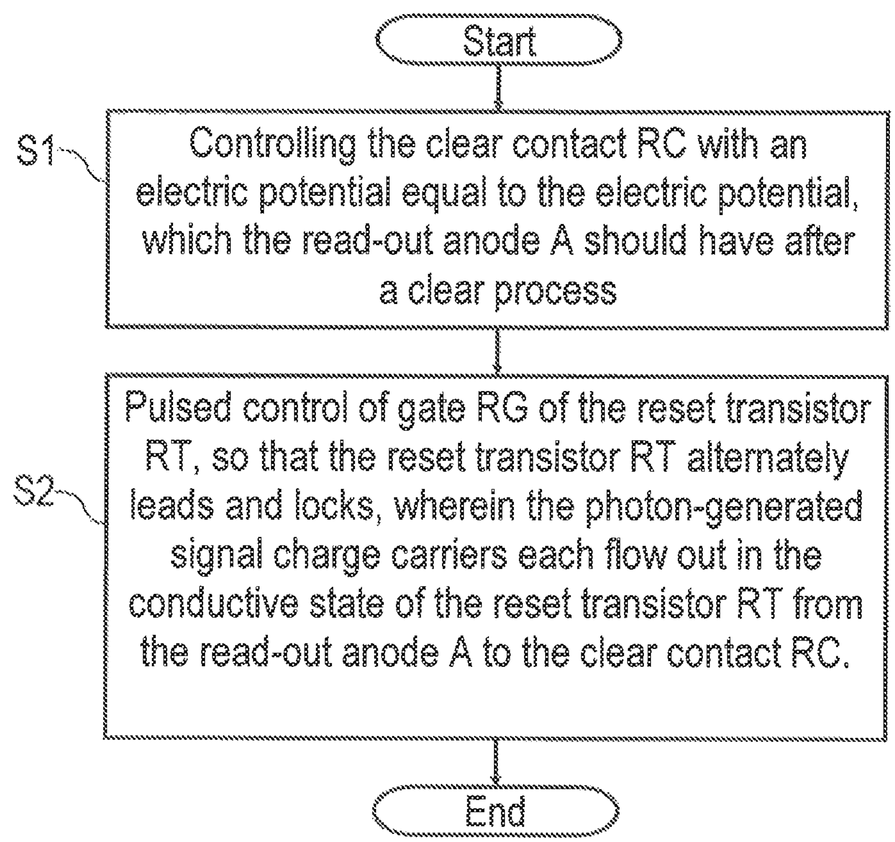
Figure 7:
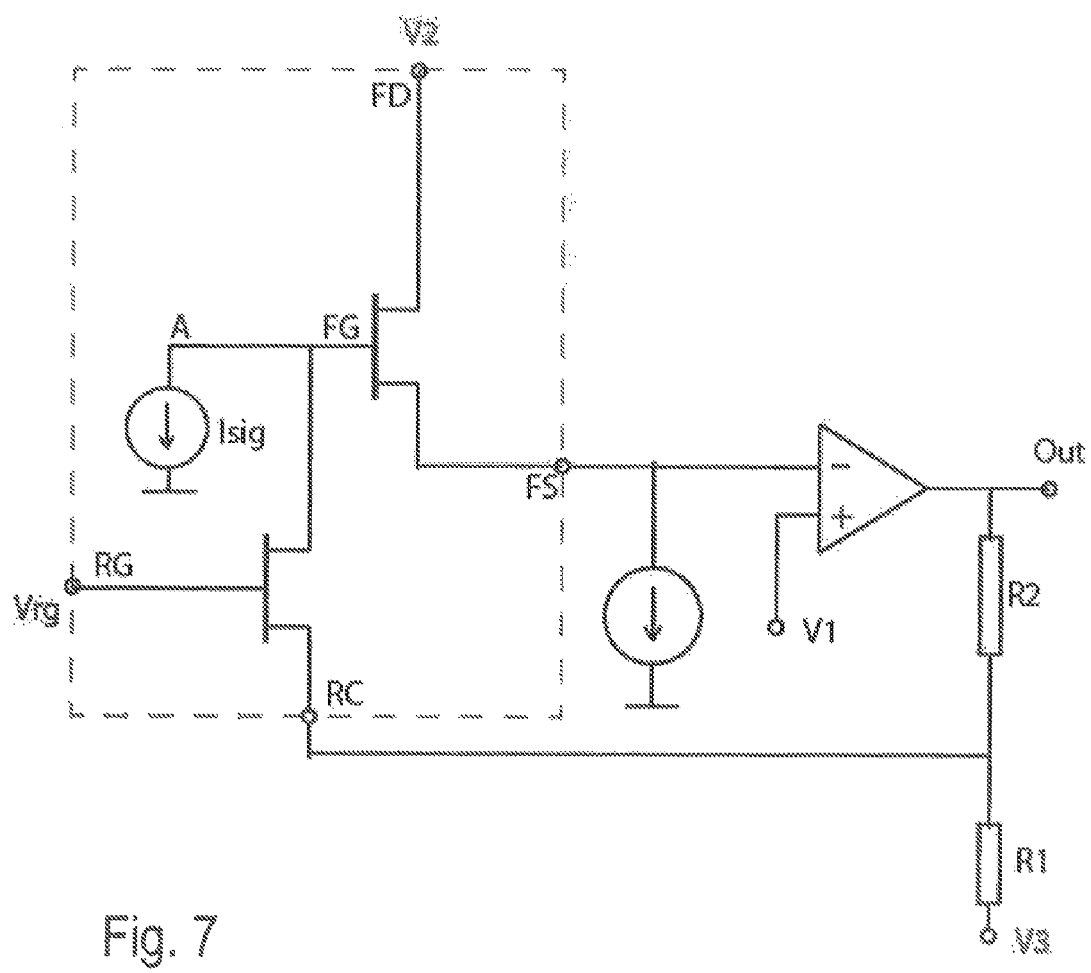
Figure 8:
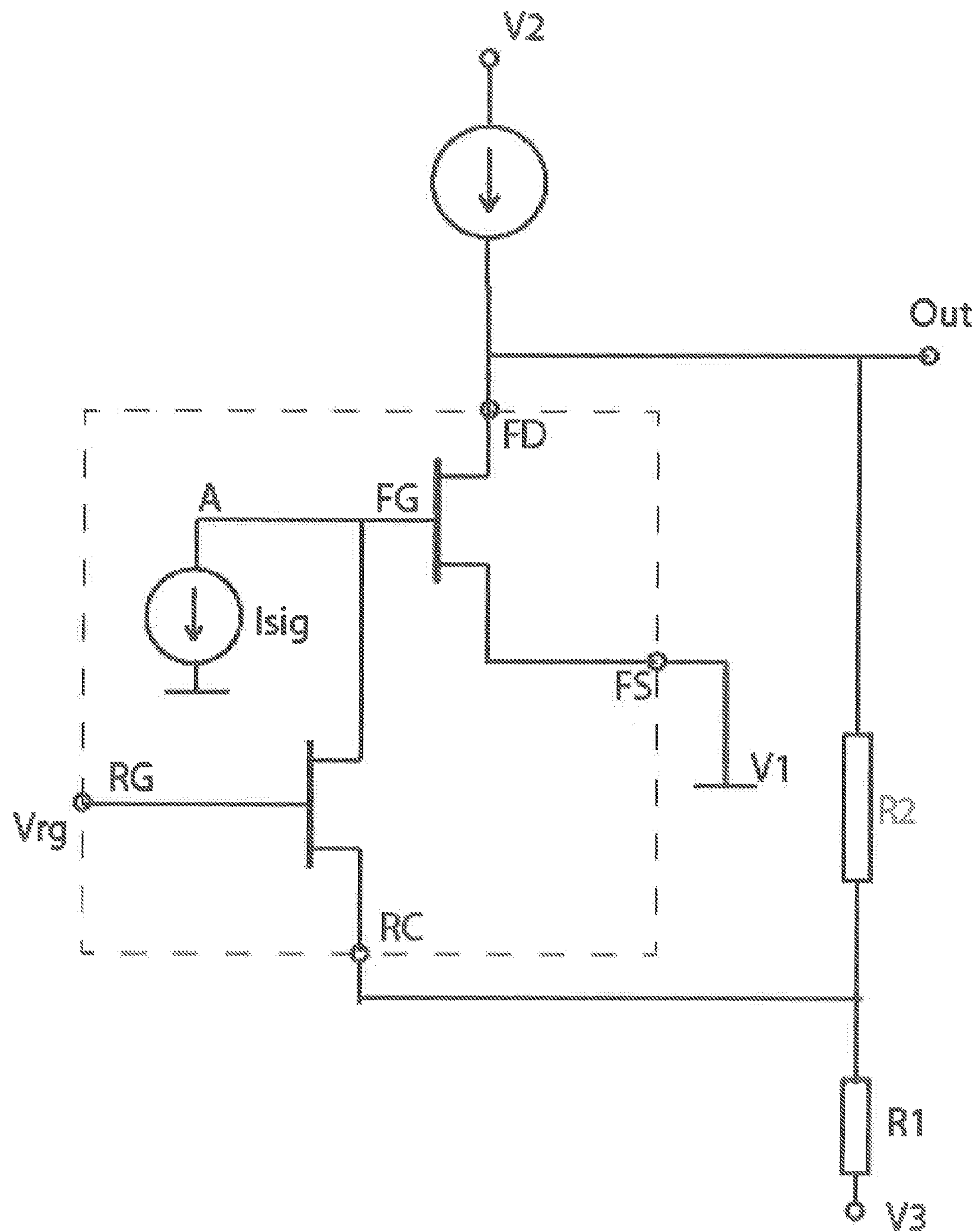
Figure 9:
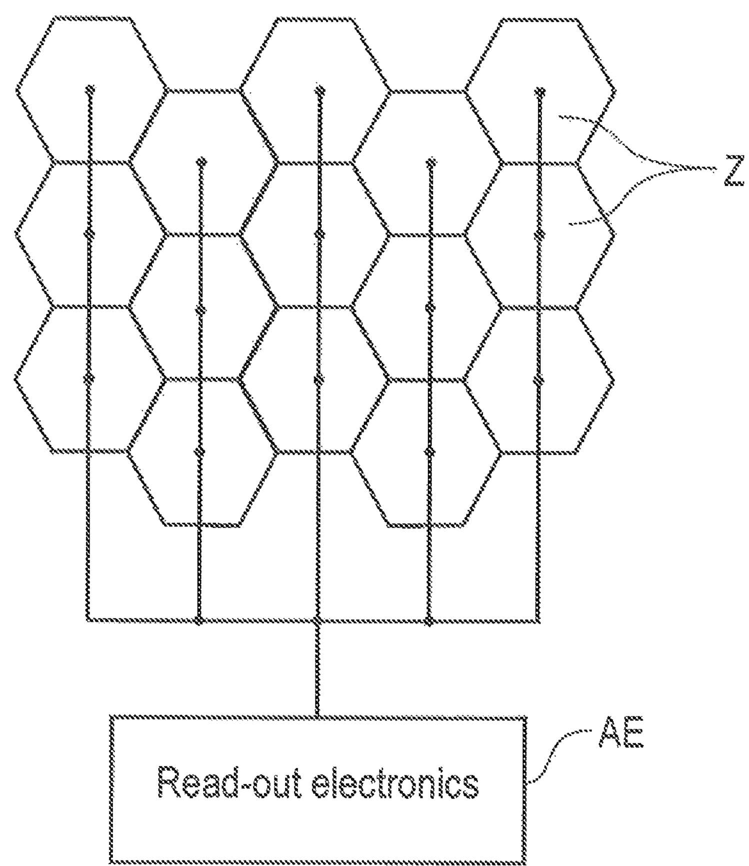

Other advantageous developments of the invention are characterized in the subclaims or are explained in more detail below together with the description of the preferred exemplary embodiments of the invention on the basis of the figures. The figures show as follows:

FIG. 1 a cross-sectional view through a semiconductor drift detector according to the invention along the section line A-A in FIG. 2, FIG. 2 a view from above of the semiconductor drift detector according to FIG. 1, FIG. 3A a cross-sectional view through the semiconductor drift detector along the section line B-B in FIG. 2 with an enhancement transistor as the reset transistor, FIG. 3B a modification of FIG. 3A with a depletion transistor as reset transistor, FIG. 3C a modification of FIG. 3A with a JFET as reset transistor, FIG. 4 a flow chart to illustrate the operating method of the semiconductor drift detector according to the invention for the measurement of an electron current, FIG. 5 a flow chart to illustrate the operating method of the semiconductor drift detector according to the invention for charge measurement with continuous reset, FIG. 6 a flow chart to illustrate an operating method of a semiconductor drift detector according to the invention for charge measurement with pulsed reset, FIG. 7 an exemplary embodiment of a feedback circuit, FIG. 8 another exemplary embodiment of a feedback circuit, as well as FIG. 9 a schematic representation of a semiconductor drift detector with a plurality of hexagonal detector cells.

The FIGS. 1, 2 and 3A show different views of a semiconductor drift detector according to the invention, which can be used for radiation detection, such as in an electron microscope.

On the one hand, the semiconductor drift detector according to the invention allows the detection of electrons ⊖, such as of backscattered electrons ⊖ in the electron microscope.

On the other hand, the semiconductor drift detector according to the invention, however, also allows the measurement of the photon energy of incident photons h·f stemming, for example, from X-ray fluorescence radiation.

For this purpose, the semiconductor drift detector according to the invention has a n-doped semiconductor substrate HS in which the incident electrons ⊖ and the incident photons h·f generate signal charge carriers, which are then detected by the semiconductor drift detector.

On the radiation inlet side, the semiconductor drift detector has a p-doped back contact RK that forms with the weakly n-doped semiconductor substrate HS a diode that is polarized in the reverse direction and serves for the depletion of the semiconductor substrate HS, wherein holes generated in the semiconductor substrate HS by exposure to radiation is sucked off via the back contact RK from the semiconductor substrate HS, which is known per se from the prior art.

However, it should be mentioned here that the back contact RK is formed in a radiation-permeable manner, namely both for the incident photons h·f and also for the incident electrons ⊖, so that both types of radiation can be detected by the semiconductor drift detector.

On the side opposite the back contact RK, the semiconductor drift contact has a plurality of concentrically arranged drift rings DR1, DR2, wherein the drift rings of DR1, DR2 generate in the semiconductor substrate HS an electric drift field, which lets the radiation-generated signal charge carrier drift to a read-out anode A, which is arranged within the innermost drift ring DR1.

In addition, a read-out transistor AT is integrated into the semiconductor drift detector according to the invention, which has a centrally arranged drain FD, a source FS arranged in an annular manner around the drain FD, a doped conductor channel K and a gate FG arranged above the conductor channel K between the source FS and the drain FD, wherein the gate FG of the read-out transistor AT is connected to the read-out anode A. In addition, the read-out transistor AT is underlayed in the semiconductor substrate HS by a deep p-doping dp. The read-out transistor AT thus generates an electrical output signal, which is a measure of the incident radiation, as a function of the radiation-generated signal charge carriers collected at the read-out anode A.

In addition, the semiconductor drift detector according to the invention still includes a reset transistor RT and an clear contact RC, wherein the reset transistor RT connects the read-out anode A to the clear contact RC in order to transfer the radiation-generated signal charge carriers collected at the read-out anode A to the clear contact RC.

The reset transistor RT is formed here as a long-channel transistor and is arranged in a slot SL that runs radially in the inner drift ring DR1 and is radially aligned. In the area of the conductor channel of the reset transistor RT, there is a buried weak n-doping dn below a gate RG, as can be seen in particular in FIG. 1.

In addition, a buried p-doping Rdp is located in the semiconductor substrate HS below the reset transistor, as can be seen in particular in FIG. 1.

The reset transistor RT connects the read-out anode A with the clear contact RC and corresponds in its functioning to a resistance, which is controllable by the gate voltage applied at the gate RG.

The FIGS. 3A-3C show different variants of the reset transistor RT as a n-channel enhancement transistor (FIG. 3A), as a n-channel depletion transistor (FIG. 3B) or as a n-channel JFET (FIG. 3C).

In the following, a first operation mode, which is suitable for the measurement of the electron current, will now be described with reference to FIG. 4, wherein the electron current is formed by the incident electrons ⊖, which can be, for example, back-scattered electrons ⊖.

Here and in the following (FIGS. 5 and 6), we assume in the description for didactic reasons that the read-out transistor AT is operated as a source follower. It serves in this context, for a fixed-potential contact at the reset contact RC, to transfer at low impedance to the outside the voltage change occurring at the read-out anode A due to the signals. Of course, it is also possible to operate the read-out transistor AT with a fixed source and gate voltage, and to take the change of drain current as a measure for the anode voltage change or reset or signal current.

There is furthermore the possibility to change the potential at the reset contact RC using a suitable feedback in such a way that the entire signal current flows out via the reset transistor RT without changing the anode potential. This point will be addressed later.

In a step S1, the clear contact RC is put to an electric potential, to which the read-out anode A is also put, as long as the signal current is zero. The gate RG of the long channel reset transistor RT is controlled in a step S2 in such a way that the conductor channel of the reset transistor RT, which acts as an adjustable resistance and where the signal current causes a voltage drop, has a suitable value, i.e. that is large enough for small currents to get a voltage drop that is large enough, and small enough to remain within the working range of the subsequent electronics, which are not represented here, for the largest currents to be expected.

In a further step S3, the voltage drop caused by the signal current, occurring at the reset transistor RT, is then read out by the read-out transistor AT, that is operated as a source follower, and transferred at low impedance to the outside.

An essential advantage of the arrangement according to the invention compared to a direct current measurement is the speed with which the read-out voltage can follow the signal current. In addition, it is largely immune to undesired coupling.

In the following, a second operation mode will now be described with reference to the flow chart shown in FIG. 5, which is used for charge measurement with continuous reset (self-reset).

In a step S1, the clear contact RC and the gate RG of the reset transistor RT are controlled such that the reset transistor RT is locked when the read-out anode A and the clear contact RC are at the same potential. If now a small (dark) current flows to the read-out anode A, its potential will change until the reset transistor RT is very little conductive.

If now a signal charge package comes to the read-out anode A, this signal charge package causes a voltage step resulting from the ratio of the incoming signal charge and the capacitance of the input node (anode).

In step S2, the anode potential and hence this voltage jump is transmitted at low impedance to the outside using the output transistor connected as a source follower. Thereafter, the reset transistor RT is more conductive, and the system slowly goes back to the initial state. The behavior is here functionally very similar to the behavior of conventional semiconductor drift detectors with a reset diode.

In a further step S3, the photon energy is determined from the potential jump and/or the electron current is determined from the anode potential.

In the following, a third operation mode will now be described with reference to the flow chart shown in FIG. 6 in which a charge measurement takes place with a pulsed reset.

In a step S1, the clear contact RC is here controlled with an electric potential, which is equal to the electric potential that the read-out anode A should have after an erasing process.

In a step S2, a pulsed control of the gate RG of the reset transistor RT then takes place, so that the reset transistor RT alternately leads and locks, wherein the photon-generated signal charge carriers each flow out in the conductive state of the reset transistor RT from the read-out anode A to the clear contact RC.

The behavior is functionally very similar to the behavior of conventional semiconductor drift detectors based on the reset diode, with the difference that the gate RG of the reset transistor is pulsed during the reset process instead of the clear contact and that there is need for an additional port for the constant erase voltage.

Furthermore, it should be mentioned that in the operation mode described above according to FIG. 4, charge pulses can also be measured, which result, for example, from X-ray photons. These charge pulses then appear as voltage spikes on a base that is determined by the slower varying electron-generated anode current.

A restriction in the read-out speed of the electron current is given by the parasitic capacitances of the sensor and the read-out electronics. By using a drift detector and the read-out transistor AT integrated therein, the dominant capacity was already made very small. To achieve additional improvement, one can ensure that the clear contact RC is not held on fixed potential, but rather used as a feedback electrode, and its potential is thus tracked such that the read-out anode A is reset to an (almost) unchanged potential. Two possible circuits for this purpose are shown in FIGS. 7 and 8.

FIG. 7 operates the read-out transistor AT in a source follower circuit. The output of the source FS drives a differential amplifier, which inverts the signal. V1 defines the source potential, V2 the drain potential of the read-out transistor AT. The voltage divider R1, R2 between Out and V3 reduces the feedback voltage returned to the clear contact RC. The potential of V3 can thus be used to adjust the pedestal of the output voltage. The potential Vrg is available at the gate RG of the long-channel reset transistor RT, which is operated in the linear range of the curve and thus has a resistance characteristic. Thus, it adjusts the feedback resistor.

FIG. 8 operates the read-out transistor AT in a common-source circuit, i.e. with a constant source potential. V1 defines the source potential. The drain FD, which is connected to a power source, gives the output voltage. The voltage divider R1, R2 between Out and V3 reduces the feedback voltage returned to the clear contact RC. The potential of V3 can thus be used to adjust the pedestal of the output voltage.

The potential Vrg is available at the gate RG of the long channel reset transistor RT, which is operated in the linear range of the curve and thus has a resistance characteristic. Thus, it adjusts the feedback resistor.

The examples shown in FIGS. 7 and 8 of an (external) feedback circuit are only two of many possibilities. The essence of these circuits is the feedback according to the invention of the output signal into the clear contact RC of the reset transistor RT.

FIG. 9 shows a simplified schematic representation of a semiconductor drift detector according to the invention, which corresponds largely to the above-described exemplary embodiments, such that, to avoid repetition, reference is made to the above description.

A particularity of this exemplary embodiment consists in the fact that the detector surface is subdivided into multiple detector cells Z, which each cover only a fraction of the total radiation-sensitive area of the semiconductor drift detector.

The individual detector cells Z are here hexagonal-shaped and form a hexagonal pack, which covers the entire radiation-sensitive detector surface.

In addition, the semiconductor drift detector has in this exemplary embodiment a common read-out electronics AE, which parallelly reads out all detector cells Z.

The advantage of this exemplary embodiment is the possibility of achieving a greater read-out speed because the radiation-generated signal charge carriers within the individual detector cells Z have, due to the smaller spatial extension of the detector cells Z, a shorter drift time.

The invention is not limited to the preferred exemplary embodiments described above. Instead, a plurality of variants and modifications is possible, which also make use of the concept of the invention and thus fall within the scope of protection. It should also be mentioned that the invention also claims protection for the subject matter and the features of the subclaims independently of the features of the claims to which they refer.

LIST OF REFERENCE SIGNS

A Read-out anode
AE Read-out electronics
AT Read-out transistor
dn Buried n-doping
dp Deep p-doping
DR1 Drift ring
DR2 Drift ring
FD Drain of the read-out transistor
FG Gate of the read-out transistor
FS Source of the read-out transistor
HS Semiconductor substrate
K Conductor channel
R1 Resistance of the voltage divider R2 Resistance of the voltage divider
RC Clear contact
Rdp Buried p-doping
RG Gate of the reset transistor
RK Back contact
RT Reset transistor
SL Slot
V1 Potential for establishing the source potential
V2 Potential for establishing the drain potential
V3 Potential for establishing the pedestal of the output voltage
Vrg Potential at the gate of the erase transistor
Out Output
Z Detector cells
⊖ Incident electrons
h·f Incident photons

The invention claimed is:

1. A semiconductor drift detector for detecting radiation, comprising:
a) a semiconductor substrate in which signal charge carriers are generated during operation
a1) through single incident photons, ions or electrons, and/or
a2) through a plurality of incident electrons, ions or other ionizing radiation with a certain signal charge carrier current,
b) a read-out anode for producing an electrical output signal as a function of the signal charge carriers,
c) a clear contact for erasing the signal charge carriers collected in the semiconductor substrate;
wherein the semiconductor drift detector can be operated in a first operation mode or in a second operation mode, the first operation mode configured to measure the energy of the incident photons, electrons or other ionizing particles, the second operation mode configured to measure the signal charge carrier current.

2. The semiconductor drift detector according to claim 1 wherein the single incident photons, ions or electrons are X-ray fluorescence radiation and/or the plurality of incident electrons, ions or other ionizing radiation are in the form of backscattered electrons.

3. The semiconductor drift detector according to claim 1 further comprising a reset transistor integrated into the semiconductor substrate which connects the read-out anode with the clear contact in order to dissipate the photon-generated signal charge carriers and/or the electron-generated signal charge carriers to the clear contact, which allows the measurement of the signal charge carrier and the measurement of the photon energy.

4. The semiconductor drift detector according to claim 3, wherein the reset transistor has a conductor channel with a specific channel length and a specific channel width, wherein
a) the channel length of the conductor channel is much greater than the width of the channel, and/or
b) the channel length is greater than 10 μm, and/or
c) the reset transistor has a gate and the conductor channel of the reset transistor has an electrical resistance which is adjustable by applying a gate voltage to the gate of the reset transistor.

5. The semiconductor drift detector according to claim 4, wherein the semiconductor drift detector has a drift ring which surrounds the read-out anode in an annular manner and generates in the semiconductor substrate an electrical drift field, which causes the signal charge carriers to drift to the read-out anode, and wherein an innermost drift ring is at least partially interrupted by a slot running from inside to the outside, and the reset transistor is arranged in the slot of the innermost drift ring, wherein the conductor channel of the reset transistor runs along the slot.

6. The semiconductor drift detector according to claim 5, wherein the drift ring is doped with a first doping type and the semiconductor substrate in the slot of the innermost drift ring is underplayed with a deep doping implantation of the first doping type.

7. The semiconductor drift detector according to claim 6, wherein:
a) the read-out anode is doped according to a second doping type and that the conductor channel of the long-channel reset transistor has a deep doping implantation of the second doping type, wherein the second doping type is opposed to the first doping type, or
b) the reset transistor is an enhancement transistor, or
c) the resent transistor is a depletion transistor, or
d) the reset transistor is a JFET.

8. The semiconductor drift detector according to claim 1 further comprising a read-out transistor integrated into the semiconductor substrate with a source, a gate and a drain, wherein the gate of the read-out transistor is connected in an electrically conductive manner with the read-out anode.

9. The semiconductor drift detector according to claim 1 further comprising a filter which filters the incident radiation such that the incident electrons are filtered out to the greatest extent below a particular electron energy level but the incident photons are let through.

10. The semiconductor drift detector according to claim 9, wherein
a) the filter is attached directly onto the semiconductor drift detector, or
b) the filter is arranged separately in space from the semiconductor drift detector.

11. The semiconductor drift detector according to claim 1 further comprising a plurality of detector cells for the detection of incident radiation, wherein the detector cells are spatially separated from one another and independently accumulate signal charge carriers according to the incident radiation.

12. The semiconductor drift detector according to claim 11, wherein
a) the individual detector cells each have separate read-out electronics, or
b) the individual detector cells have common read-out electronics which read the detector cells out in parallel.

13. The semiconductor drift detector according to claim 12, wherein the common read-out electronics has for each of the detector cells a read-out transistor with a source, a drain, a gate and a conductor channel between the source and the drain, and
a) the read-out transistors of the detector cells are each connected with their source and with each other, and/or
b) the read-out transistors of the detector cells are each connected with their drain and with each other.

14. The semiconductor drift detector according to claim 13, wherein
a) the individual cells each have a clear contact for erasing the signal charge carriers collected in the respective detector cells, and
b) the read-out transistors of the detector cells are each electrically connected with their clear contact and with each other.

15. The semiconductor drift detector according to claim 11, wherein
a) the detector cells are each hexagonal, and/or
b) the detector cells are arranged together on the same semiconductor substrate.

16. A method for operating the semiconductor drift detector of claim 1 comprising transporting the photon-generated signal charge carriers and/or the electron-generated signal charge carriers to the clear contact via a reset transistor integrated into the semiconductor substrate which connects the clear contact with the read-out anode, and a) measuring the voltage drop across the conductor channel of the reset transistor as a measure of the signal charge carrier current of the incident electrons, and/or b) measuring the time variation of the voltage drop across the conductor channel of the reset transistor as a measure of the photon energy of the incident photons.

17. The operating method according to claim 16, wherein a) a read-out transistor with a source, a gate and a drain is integrated into the semiconductor substrate, wherein the read-out transistor is connected in an electrically conductive manner with the read-out anode, and b) the read-out transistor is operated as a source follower and transfers outwardly the potential of the read-out anode at low impedance.

18. The operating method according to claim 17, wherein the gate of the reset transistor for erasing is pulsed in order to bring the read-out anode to the potential of the clear contact and then to lock the reset transistor again for the measurement of the radiation-generated signal charge carrier.

19. The operating method according to claim 17, wherein the gate of the reset transistor and the clear contact are placed on fixed electrical potentials, so that the electrical potential of the read-out anode is set in the absence of charge signals to a fixed potential, which value essentially results from the potential of the gates of the reset transistor and the threshold voltage of the reset transistor.

20. The operating method according to claim 16 further comprising:

a) measuring the potential of the read-out anode as a measure of the signal charge carrier current of the incident electrons, and/or b) measuring a potential jump of the potential of the read-out anode as a measure of the photon energy of the incident photons.

* * * * *